United States Patent [19]

Kohno et al.

[11] Patent Number: 4,830,499
[45] Date of Patent: May 16, 1989

[54] OPTICAL DEVICE CAPABLE OF MAINTAINING PUPIL IMAGING

[75] Inventors: Michio Kohno, Tokyo; Hideki Ina, Yokohama; Akiyoshi Suzuki, Tokyo, Japan

[73] Assignee: Canon Kabushiki Kaisha, Tokyo, Japan

[21] Appl. No.: 94,086

[22] Filed: Sep. 4, 1987

Related U.S. Application Data

[63] Continuation of Ser. No. 28,027, Mar. 17, 1987, abandoned, which is a continuation of Ser. No. 915,908, Oct. 6, 1986, abandoned, which is a continuation of Ser. No. 512,631, Jul. 11, 1983, abandoned.

[30] Foreign Application Priority Data

Jul. 23, 1982 [JP]  Japan ............................... 57-128560

[51] Int. Cl.$^4$ ..................... G01B 11/00; G02B 13/22
[52] U.S. Cl. .................................... 356/400; 356/401
[58] Field of Search ............... 356/400, 401; 350/425, 350/486, 548, 557, 563

[56] References Cited

U.S. PATENT DOCUMENTS

| | | | |
|---|---|---|---|
| 3,346,739 | 10/1967 | Jenkner | 355/60 |
| 3,709,602 | 1/1973 | Satomi | 355/60 |
| 4,062,623 | 12/1977 | Suzuki et al. | 350/91 |
| 4,173,398 | 11/1979 | Okamoto et al. | 356/126 |
| 4,251,129 | 2/1981 | Suzki et al. | 356/400 |
| 4,294,538 | 10/1981 | Ban | 355/60 |
| 4,402,596 | 10/1983 | Kanatani | 355/53 |

FOREIGN PATENT DOCUMENTS

| | | |
|---|---|---|
| 2615084 | 1/1985 | Fed. Rep. of Germany . |
| 0751149 | 6/1956 | United Kingdom . |
| 1404025 | 8/1975 | United Kingdom . |
| 1579579 | 11/1980 | United Kingdom . |

*Primary Examiner*—Richard A. Rosenberger
*Attorney, Agent, or Firm*—Fitzpatrick, Cella, Harper & Scinto

[57] ABSTRACT

An optical device includes an objective lens, a relay lens group for relaying the beam from the objective lens, and a compensator for compensating the variation in the optical path length, which occurs when the relative position between said objective lens and said relay lens group changes, by expanding or contracting the optical path.

7 Claims, 3 Drawing Sheets

OPTICAL DEVICE CAPABLE OF MAINTAINING PUPIL IMAGING

This application is a continuation of application Ser. No. 028,027 filed 3-17-87 now abandoned, which was a continuation of application Ser. No. 915,908 filed 10-6-86 now abandoned which was a continuation of application Ser. No. 512,613 filed 7-11-83 now abandoned.

BACKGROUND OF THE INVENTION

1. Field of the Invention

The present invention relates in a general way to an optical system for observing an object to be inspected with the naked eye or through a videomonitor and/or photoelectrically detecting an image of the object or a series of light intensity information representing the object. More particularly, the present invention relates to an optical system usable with an apparatus for manually or automatically aligning a wafer with a photomask having a semiconductor integrated circuit pattern, an apparatus for detecting a mark on a photomask and a mark on an exposure device to place the photomask at a correct position in a photomask stage, or an apparatus for inspecting defects on a surface of a semiconductor wafer.

2. Description of the Prior Art

Recently, a semiconductor integrated circuit has been miniaturized, and the tendency of the miniaturization still continues. To meet the tendency, optical projection systems have been proposed as one of the means usable with a semiconductor aligner. The optical projection systems are such that an electrostatic circuit formed in a photomask or on a reticle is transferred onto a wafer through a lens system and/or reflector system with high resolution power. Also, other techniques, such as contact exposure and proximity exposure, are utilized.

Those systems require that the alignment work is made automatic, since the photomask and the wafer have to be aligned before the light application, and also since a great number of wafers have to be processed at a high speeds. Many proposals have been made to achieve this, for example, U.S. Pat. No. 4,251,129 assigned to the Assignee of the present application.

To achieve this automation, the above mentioned U.S. patent proposes that spatial frequency filtering is effected on the pupil plane, or a plane conjugate with the same, of the alignment optical system. In those types of systems, it is also important that the performance of the imaging of the pupil is ensured, in addition to the imaging of the object (alignment mark). However, the optical system which has to satisfy those dual requirements, would have difficulty in changing the length of the optical path of the alignment optical system. In other words, when the length of the optical path is to be changed in use, it would be difficult to satisfy both of the above described two requirements.

In an aligning apparatus, such a change in the optical path length is required. This will be explained in detail in conjunction with FIG. 1, wherein a photomask MA is conjugate with a wafer WA with respect to a projection lens PL. The optical system further includes objective lenses L1 and L2, beam splitters M1 and M2 having a half-mirror and relay lenses L3 and L4, which each have a function of forming an image with the rays from each of the objective lenses L1 and L2. Although each of the lenses is shown as a single lens, it may have plural lens elements. The other optical elements are not shown in the Figure for the sake of simplicity. The optical system further includes illumination light sources LS1 and LS2, and condensing lens L5 and L6 which form images of the light sources LS1 and LS2 on the pupil plane of the objective lenses L1 and L2, respectively, to illuminate the object by Kohler illumination.

The objective lens unit comprising the objective lens L1, the beam splitter M1, condensing lens L5 and the illumination light source LS1, and the other objective lens unit comprising the objective lens L2, the beam splitter M2, condensing lens L6 and the illumination light source LS2, are each movable as a unit toward and away from each of the imaging lenses L3 and L4, thus allowing the objective lenses L1 and L2 to move to such positions as to be expected to face the respective alignment marks on the mask, so that the alignment marks are observed while the objective lenses are placed in the positions shown by broken lines L1' and L2', for example.

When a wafer chip of a different size is loaded, the position of the alignment marks also changes necessarily, so that the objective lenses have to be displaced. The change in the position of the objective lens, L1 or L2, leads to the change in the distance therefrom to the imaging lens L3 or L4, resulting in the optical length change.

In another part of the manufacturing process which has been substantially automated, the transportation and loading of photomasks are automated, and the masks have to be loaded with extreme positional accuracy, so that another alignment operation is needed. It is possible to utilize the mask-wafer alignment optical system for such other alignment. In this case, the objective lens is moved to face the setting mark with the result of a change in the optical path length.

FIG. 2 shows the optical system diagrammatically, wherein the optical system faces a surface O of an object, e.g., a mask. The optical system includes an objective lens L1 and imaging lens L3. The image of the object is formed on the imaging surface I. Depicted by reference character P is a pupil. The rays from a point on the object surface O are made parallel by the objective lens L1 and imaged on the imaging surface I by the imaging lens L3. The broken lines show the imaging of the pupil. The illumination optical system has been omitted for the sake of simplicity of explanation.

The displacement or the translational movement of the objective lens, explained with FIG. 1, corresponds to the change, in FIG. 2, of the distance l between the objective lens L1 and the imaging lens L3 while maintaining the distance $l_0$ between the objective lens L1 and the object O constant, for example, by moving the imaging lens L3 toward the objective lens L1 to reduce the distance l. On this occasion of the change in the distance l, the imaging of the pupil shown by the broken lines is not maintained, even if the imaging of the object can be easily maintained. This results in the degraded performance of the spatial frequency filtering.

SUMMARY OF THE INVENTION

The object of the invention is to provide an optical system wherein the imaging of the pupil as well as the imaging of the object are maintained when a change in the relative position of the optical elements takes place.

Further objects and advantages of this invention will be apparent from the accompanying drawings and following description of preferred embodiments.

DESCRIPTION OF THE PREFERRED EMBODIMENTS

Figure 1:
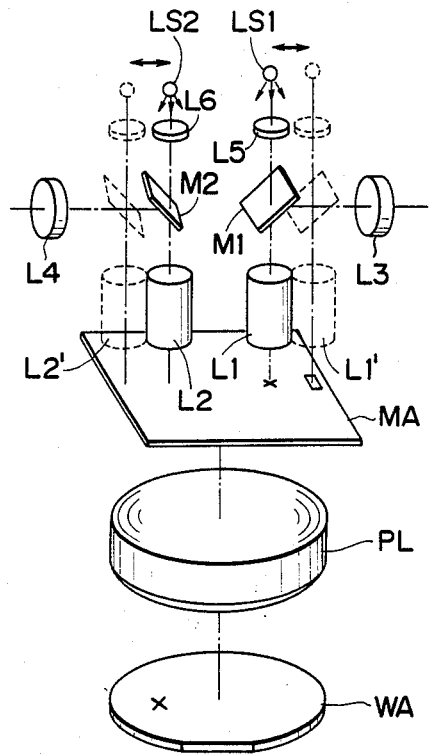
FIG. 1 shows a perspective view of a prior art optical system for a mask-wafer alignment apparatus.
Figure 2:
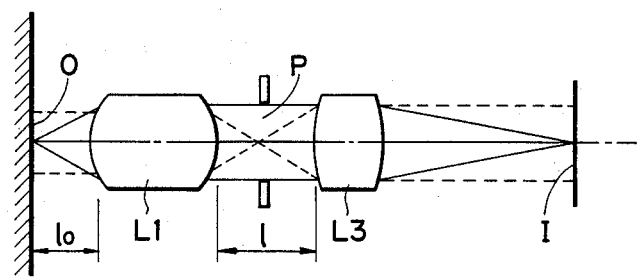
FIG. 2 shows a diagrammatical illustration of the optical system of FIG. 1.
Figure 3:
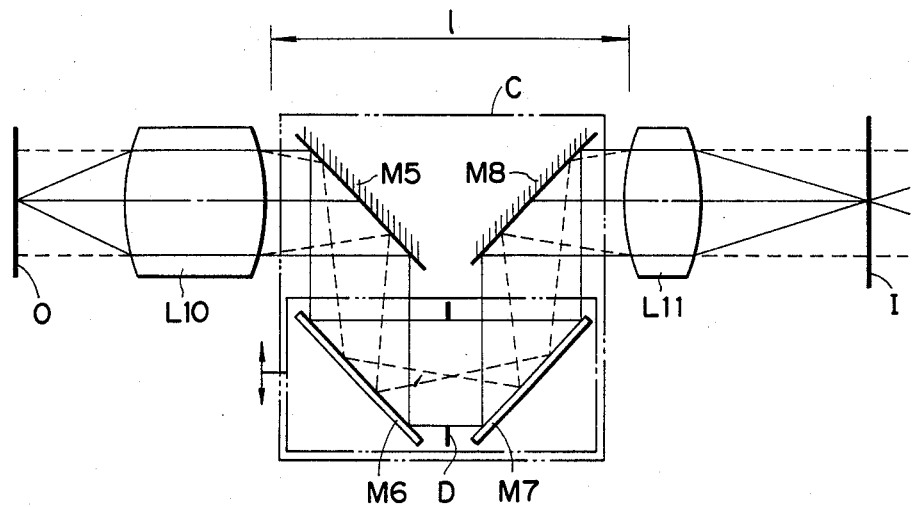
FIG. 3 shows an optical system of a basic embodiment according to the present invention.

FIG. 3 shows an optical system of the present invention, wherein reference character O and I depict an object surface and an image surface, respectively. The optical system includes an objective lens L10 and an imaging lens L11, wherein the positional relation therebetween is variable, that is, the distance between the lenses L10 and L11 changes. A compensator C for compensating for the change in the optical path length includes a fixed mirror M5, of which the mirror surface is inclined with respect to the optical axis, movable mirrors M6 and M7 which are also inclined, a fixed mirror M8 and a field stop D. The movable mirrors M6 and M7 move or translate toward and away from the fixed mirrors M5 and M8 while maintaining the parallel relation with the fixed mirrors M5 and M8, as shown by arrows in FIG. 3, to constitute an optical trombone. The amount of the translational movement of the movable mirror M6 and M7 is one half ($\Delta l/2$) of the change ($\Delta l$) in the distance l. When the distance l, for example, reduces by $\Delta l$, the movable mirror M6 and M7 are moved as a unit downwardly by $\Delta l/2$, so that the total optical path length in the compensator C expands by $\Delta l$. Therefore, the length of the optical path from the objective lens L10 to the imaging lens L11 via the fixed mirror M5, the movable mirrors M6 and M7 and the fixed mirror M8 remains unchanged despite the change ($\Delta l$) in the distance l. When the distance l expands by $\Delta l$, on the contrary, the movable mirrors M6 and M7 are moved as a unit upwardly by $\Delta l/2$ to compensate for the change in the similar manner.

It will be understood that by the compensation, the imaging of the object and the imaging of the pupil are both maintained. An image of an illumination light source may be formed on the plane (focal plane) in which the field stop D of the objective lens is formed, to illuminate the object through the objective lens L10. In this case, it should be noted that the optical relation of the pupil imaging and that of the light source imaging are the same. The mirror M5 and M6 may be made by mirror treatment on the angularly disposed surfaces of a triangular prism.

Figure 4:
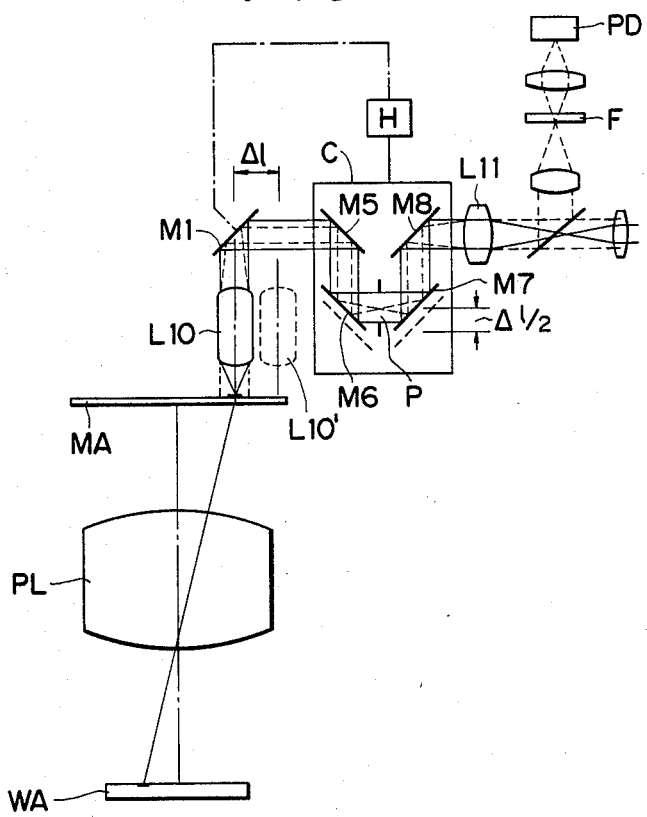
FIG. 4 shows the optical system of the present invention incorporated in an image projection apparatus.

FIG. 4 shows a projection type aligner incorporating the optical system of the present invention. Two optical systems (for righthand side and lefthand side) are used in the actual machines, but only one system (righthand side) is shown for the sake of simplicity, in which a photomask and a wafer are designated by reference characters MA and WA, respectively, which are conjugate with respect to a projection lens PL. The optical system includes an objective lens L10 and a beam splitter M1. An illumination optical system for illuminating the photomask MA through the beam splitter is not shown in the Figure for the sake of simplicity. A compensator C includes a fixed mirror M5, movable mirrors M6 and M7, and a fixed mirror M8. The movable mirrors M6 and M7 are movable as a unit upwardly and downwardly in the Figure, in synchronism with the horizontal movement of the unit including the objective lens L10 and the beam splitter M1. The amount of the movable mirror unit movement is also one half ($\Delta l/2$) of the objective lens movement ($\Delta l$). And, the synchronization is provided by a regulating mechanism H. It is a possible alternative to make the beam splitter M1 function also as the fixed mirror M5.

The illumination light from the unshown illumination source scanning a light point is projected on the wafer WA through the photomask MA and the projection lens PL. The light rays from the alignment marks on the photomask MA and the wafer WA which are conjugate, pass through the objective lens L10 and become parallel rays and are directed through the beam splitter M1, the fixed mirror M5, the movable mirrors M6 and M7 and the fixed mirror M8 to the imaging lens L11, which forms an image on the imaging surface I. At a position conjugate withthe pupil P, the spatial frequency filtering F is effected, and the light rays passed therethrough impinge on a photodetector PD.

When a wafer of different size is loaded, the positions of the alignment marks are not the same, so that the objective lens L10 is displaced or translated to the position shown by broken lines L10', for example, by the distance $\Delta l$. Simultaneously therewith, the regulating mechanism H operates to move the movable mirrors M6 and M7 as a unit downwardly by $\Delta l/2$. Thus, the imaging of the object and the imaging of the pupil are both maintained despite the horizontal movement of the objective lens L10, so that the displacement of the objective lens L10 does not result in any disadvantages in the photoelectric detection of the alignment marks.

The application of the present invention is not limited to the aligner optical system, but usable with a microscopic optical system wherein the objective lens is to be displaced for some reason.

Figure 5:
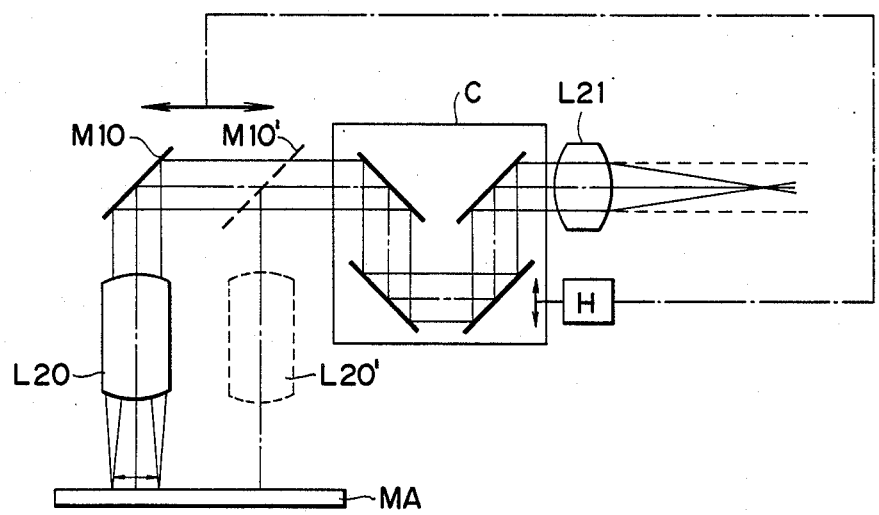
FIG. 5 shows another embodiment of the optical system according to the present invention.

FIG. 5 shows an example wherein the optical system of the present invention is used for inspecting the photomask MA to find a flaw or foreign matters attached thereto. During such inspection, some types of machines effect the spatial frequency filtering with respect to the light reflected by the mask. In this case, however, there is a limitation to the size of the view field of the microscopic objective lens L20, so that the inspectable area is limited. For this reason, the system has difficulty in meeting the large-sized wafer. The difficulty is eliminated by the present invention. The optical system further includes a mirror M10 having a first position shown by the solid lines and a different position shown by the broken lines at M10'. The optical path length compensator C is inserted across the optical path between the microscopic objective lens L20 and the adjacent converging lens L21. The inspection is first carried out when the microscopic objective lens L20 is in the position shown by the solid lines, and then moved to a different position, for example, a position shown by the broken lines L20'. Since the variation, given by the movement, in the optical path length is compensated by the compensator C driven by the regulating mechanism H, the inspection can be effected with the same precision as with the case before the movement. The number of positions which can be taken is not limited to two, but three or more positions are possble, as desired.

As described in detail in the foregoing, the imaging of the object and the imaging of the pupil are both maintained by the compensator C, despite the relative movement between the optical elements. The present invention is usable with various detection or inspection apparatus to provide an accurate operation. According to the invention, it is not necessary to be concerned about the imaging of the pupil, so that the arrangement of the optical elements is made more easily and more simply.

What is claimed is:

1. A mask aligner usable with a photo-mask having a pattern including an alignment mark thereon, and a wafer having a photosensitve member, said aligner comprising:

an objective lens system movable parallel to the photo-mask, said system having a predetermined pupil;

an imaging optical system for receiving light from said objective lens system to form an image of the alignment mark of said photo-mask and an image of said pupil;

an optical path length correcting means, disposed in an optical path of said objective lens system and said imaging optical system, for maintaining the image positions of the alignment mark and the pupil irrespective of the position of said objective lens system, said optical path length correcting means including fixed reflecting means and movable reflecting means opposed to each other, wherein the light from said objective lens system is directed to said imaging optical system by way of both of said fixed reflecting means and said movable reflecting means, and wherein the optical path length is controlled by moving said movable reflecting means; and means for interrelating the movement of said objective lens system and the operation of said optical path length correcting means.

2. A mask aligner according to claim 1, further comprising a spatial filter disposed at the imaging position of the pupil, and a photodetector for receiving light from photo-mask after the light is filtered by said spatial filter.

3. A mask aligner according to claim 1, wherein said fixed reflecting means and said movable reflecting means are disposed in opposition at an angle with respect to each other.

4. A mask aligner according to claim 1 wherein said fixed reflecting means includes two fixed reflecting surfaces and said movable reflecting means includes two movable reflecting surfaces respectively disposed in opposition to said two fixed reflecting surfaces.

5. An optical system for observing a surface of an object, said system comprising:

first optical means having a pupil, said first optical means transmitting light from the surface of the object;

second optical means for receiving the light from said first optical means, said second optical means forming images of said pupil and the surface of the object, wherein said first optical means is movable relative to said second optical means; and an optical path length correcting means, disposed between said first means and said second optical means, for correcting the optical path length to maintain the imaging position of said pupil and said surface of the object, said optical path length correcting means including fixed reflecting means and movable reflecting means opposed to each other, wherein the light from said first optical means is directed to said second optical means by way of both of said fixed reflecting means and said movable reflecting means, and wherein the optical path length is controlled by moving said movable reflecting means.

6. An optical system according to claim 5, wherein said fixed reflecting means and said movable reflecting means are disposed in opposition at an angle with respect to each other.

7. An optical system according to claim 5, wherein said fixed reflecting means includes two fixed reflecting surfaces and said movable reflecting means includes two movable reflecting surfaces respectively disposed in opposition to said two fixed reflecting surfaces.

* * * * *

UNITED STATES PATENT AND TRADEMARK OFFICE
CERTIFICATE OF CORRECTION

PATENT NO. : 4,830,499
DATED : May 16, 1989
INVENTOR(S) : MICHIO KOHNO, ET AL.

Page 1 of 2

It is certified that error appears in the above-identified patent and that said Letters Patent is hereby corrected as shown below:

COLUMN 1

Line 9, "Ser. No. 512,613 filed 7-11-83" should read --Ser. No. 512,631 filed 7-11-83--.
Line 16, "videomonitor" should read --video-monitor--.
Line 43, "a" should be deleted.

COLUMN 2

Line 4, "condensing lens L5 and L6" should read --condensing lenses L5 and L6--.

COLUMN 3

Line 16, "reference character O and I" should read --reference characters O and I--.
Line 33, "mirror M6 and M7" should read --mirrors M6 and M7--.
Line 35, "movable mirror M6 and M7" should read --movable mirrors M6 and M7--.
Line 37, "Al." should read --$\Delta$ l.--.
Line 54, "mirror M5 and M6" should read --mirrors M5 and M6--.

COLUMN 4

Line 22, "withthe" should read --with the--.
Line 68, "possble," should read --possible,--.

UNITED STATES PATENT AND TRADEMARK OFFICE
CERTIFICATE OF CORRECTION

PATENT NO. : 4,830,499
DATED : May 16, 1989
INVENTOR(S) : MICHIO KOHNO, ET AL.

Page 2 of 2

It is certified that error appears in the above-identified patent and that said Letters Patent is hereby corrected as shown below:

COLUMN 5

Line 14, "photosensitve" should read --photosensitive--.

COLUMN 6

Line 1, "photo-mask" should read --said photo-mask--.
Line 7, "claim 1" should read --claim 1,--.
Line 23, "first means" should read --first optical means--.
Line 44, insert Claim 8 as follows:
--8. A system according to Claim 5, wherein said first optical means is movable in a direction parallel to a surface of the object.--

Signed and Sealed this

Tenth Day of April, 1990

*Attest:*

HARRY F. MANBECK, JR.

*Attesting Officer*  *Commissioner of Patents and Trademarks*